United States Patent
Dubreuil et al.

(10) Patent No.: US 8,663,751 B2
(45) Date of Patent: Mar. 4, 2014

(54) METHOD FOR STABLE HYDROPHILICITY ENHANCEMENT OF A SUBSTRATE BY ATMOSPHERIC PRESSURE PLASMA DISPOSITION

(75) Inventors: Marjorie Dubreuil, Lummen (BE); Dirk Vangeneugden, Opgrimbie (BE)

(73) Assignee: Vlaamse Instelling Voor Technologisch Onderzoek N.V. (VITO), Mol (BE)

( * ) Notice: Subject to any disclaimer, the term of this patent is extended or adjusted under 35 U.S.C. 154(b) by 314 days.

(21) Appl. No.: 12/663,405

(22) PCT Filed: Sep. 19, 2008

(86) PCT No.: PCT/EP2008/062497
§ 371 (c)(1),
(2), (4) Date: Dec. 7, 2009

(87) PCT Pub. No.: WO2009/037331
PCT Pub. Date: Mar. 26, 2009

(65) Prior Publication Data
US 2010/0173162 A1    Jul. 8, 2010

(30) Foreign Application Priority Data
Sep. 19, 2007  (EP) .................................... 07116708

(51) Int. Cl.
*C23C 16/448*  (2006.01)

(52) U.S. Cl.
USPC ........................................ 427/569; 427/248.1

(58) Field of Classification Search
None
See application file for complete search history.

(56) References Cited

U.S. PATENT DOCUMENTS

| | | | |
|---|---|---|---|
| 5,895,558 A * | 4/1999 | Spence | 204/164 |
| 2004/0258931 A1 | 12/2004 | Zamora | |
| 2005/0173251 A1* | 8/2005 | Mashino | 205/127 |
| 2005/0232658 A1* | 10/2005 | Kabata et al. | 399/165 |
| 2006/0244386 A1* | 11/2006 | Hooke et al. | 315/111.21 |

FOREIGN PATENT DOCUMENTS

| | | |
|---|---|---|
| EP | 1 785 198 A1 | 5/2007 |
| JP | 3-236475 | 10/1991 |
| WO | WO 95/04609 | 2/1995 |
| WO | WO 00/32248 | 6/2000 |
| WO | WO 03/086031 | 10/2003 |
| WO | WO 2005/089957 A1 | 9/2005 |
| WO | WO 2005/095007 A1 | 10/2005 |

OTHER PUBLICATIONS

O'Neill, Chem. Vap. Deposition, 2004, 10, No. 3 p. 136.*
Dubreuil, Surface and Coatings Tech., V202, No. 20, Jul. 2008, p. 5036.*

(Continued)

*Primary Examiner* — Joseph Miller, Jr.
(74) *Attorney, Agent, or Firm* — Merchant & Gould P.C.

(57) ABSTRACT

A method for applying a hydrophilic coating on a substrate includes: providing a substrate (1), producing an atmospheric pressure plasma discharge in the presence of a gas, at least partially exposing the substrate to the atmospheric pressure plasma discharge. The method introduces a liquid aerosol (6) or a vapor of coating forming material into the atmospheric pressure plasma discharge, thereby forming a coating on the substrate. The coating forming material is a non-polymerizable acetate derivative, and is ethyl acetate in one embodiment.

15 Claims, 1 Drawing Sheet

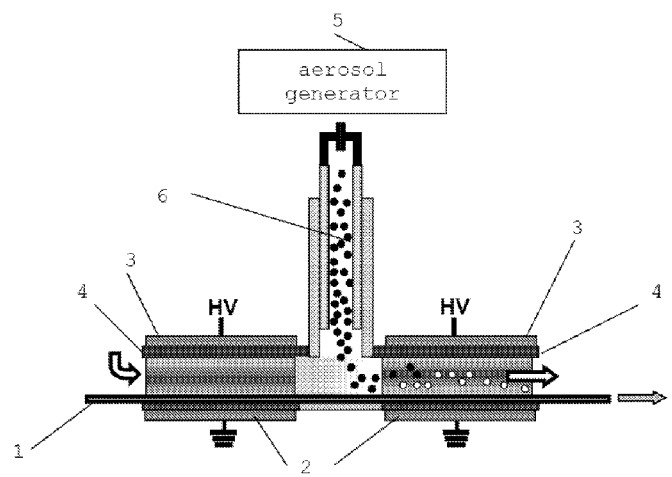

(56) References Cited

OTHER PUBLICATIONS

Lima et al., "Production and desposition of adsorbent films by plasma polymerization on low cost micromachined non-planar microchannels for preconcentration of organic compound in air," *Sensors and Actuators* (2005) 108: 435-444. XP 004928494.

Kim et al., "Effects of atmospheric plasma treatment on the interfacial characteristics of ethylene-vinyl acetate/plyurethane composites," *Journal of Colloid and Interface Science* (2004) 271: 187-191.

Form PCT/ISA/237 for International Application PCT/EP2008/062497, Sep. 2009.

Form PCT/ISA/220 for International Application PCT/EP2008/062497, Sep. 2009.

Form PCT/IPEA/401 for International Application PCT/EP2008/062497, Sep. 2009.

Form PCT/IPEA/409 for International Application PCT/EP2008/062497, Sep. 2009.

Form PCT/IB/301 for International Application PCT/EP2008/062497, Sep. 2009.

Form PCT/IB/308 for International Application PCT/EP2008/062497, Sep. 2009.

Form PCT/IB/332 for International Application PCT/EP2008/062497, Sep. 2009.

Form PCT/ISA/202 for International Application PCT/EP2008/062497, Sep. 2009.

Form PCT/RO/105 for International Application PCT/EP2008/062497, Sep. 2009.

Form PCT/IPEA/402 for International Application PCT/EP2008/062497, Jul. 2009.

Form PCT/IPEA/416 for International Application PCT/EP2008/062497, Sep. 2009.

Vangeneugden, Dirk et al., "Aerosol-Assisted Plasma Deposition of Barrier Coatings using Organic-Inorganic Sol-gel Precursor Systems**" Chem. Vap. Deposition 2005, 11, 491-496.

Dubreuil, M.F. et al., "Use of atmospheric pressure plasma technology for durable hydrophilicity enhancement of polymeric substrates" Surface & Coatings Technology 202 2008, 5036-5042.

* cited by examiner

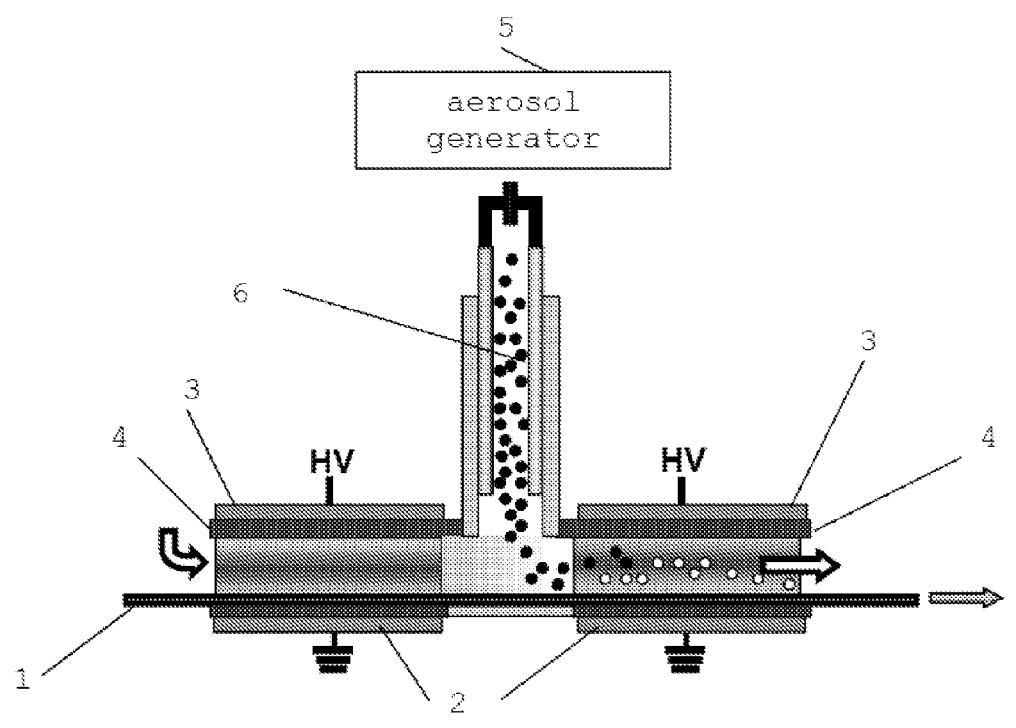

```
                    5
              ┌───────────┐
              │  aerosol  │
              │ generator │
              └───────────┘
                    │
         6
``` aerosol generator

METHOD FOR STABLE HYDROPHILICITY ENHANCEMENT OF A SUBSTRATE BY ATMOSPHERIC PRESSURE PLASMA DISPOSITION

This application is a National Stage Application of PCT/EP2008/062497, filed Sep. 19, 2008, which claims benefit of Serial No. 07116708.4, filed Sep. 19, 2007 in the EPO and which applications are incorporated herein by reference. To the extent appropriate, a claim of priority is made to each of the above disclosed applications.

FIELD OF THE INVENTION

The present invention is related to the deposition of stable hydrophilic coatings based on the atmospheric pressure plasma deposition.

STATE OF THE ART

From an industrial point of view, there is an increasing interest to control the surface functionality and the surface properties of all kinds of substrates. More and more demands arise to control for example adhesion and release properties of different substrates, more specifically of polymer substrates. These properties are linked to the hydrophobic or hydrophilic character of the surface.

A commonly used method for the modification of surface properties, is the use of wet chemical deposition of coatings on a given substrate. However, solvents have to be used, leading to increased costs, and health and environmental issues.

A widely used method for the polymer surface modification is corona treatment at atmospheric pressure. The drawbacks of this method are that it produces inhomogeneous surface changes and that the changes are not stable in time. Corona treatment may be combined with a wet chemical deposition.

Patent WO2005/089957 describes the use of atmospheric pressure plasma for the pre-treatment of a given substrate, after which a solvent-containing reactive solution is applied to form a stable coating after solvent removal.

Another commonly used method for the modification of surface properties of a substrate and/or to produce coatings on a substrate is to submit the substrate to a low-pressure plasma treatment. In particular, it is known to use a polymerizable pre-cursor (also called a monomer) as the coating forming material, and to introduce said pre-cursor into a plasma discharge, where polymerization takes place to form a polymer coating on the substrate.

Patent WO00/32248 describes the enhancement of the surface properties of polymers for medical applications using low pressure plasma in the presence of various gaseous precursors or hydrocarbons.

Patent US2004258931 describes the plasma crosslinking at low pressure of a double bound containing monomer on an hydrophilic polymeric layer deposited on the substrate to enhance the hydrophilicity of medical devices.

Patent WO95/04609 describes the deposition of a hydrophilic coating on a lens by low-pressure plasma technology using a carrier gas comprising hydrogen peroxide and at least one functional organic compound.

However, low-pressure plasma has the disadvantage of requiring highly cost-effective reactors and therefore large investments for industrializing the process. In addition low-pressure plasma processes are generally batch processes which cannot be integrated in existing continuous production facilities.

Recent developments in the field of atmospheric plasma technology are creating new perspectives beyond current state-of-the art in corona pretreatment of materials. By controlling the gas atmosphere and electrical conditions, one can increase the efficiency of the plasma surface treatment significantly. Furthermore, by adding reactive chemical precursors to the plasma discharge, the surface chemistry can be controlled and thin functional coatings can be deposited. In document 'Production and deposition of adsorbent films by plasma polymerization on low cost micromachined non-planar microchannels for preconcentration of organic compound in air', Lima et al, Sensors and Actuators, vol. 108, no 1-2 (2005), a plasma deposition of ethyl acetate is described, resulting in a hydrophilic film.

Plasma grafting may be employed to enhance the surface hydrophilicity of polymers. It is usually conducted by first exposing a polymer to a plasma such as argon, helium, or nitrogen for a short time (a few seconds). The process introduces many radicals to the surface of the polymer. Afterwards, the polymer is brought into contact with the vapour of a monomer or with air. However, in this case, the improved properties are not stable in time, and the substrate tends to come back to its original state.

AIMS OF THE INVENTION

The present invention aims to provide a process to permanently enhance the hydrophilicity of a given substrate using an atmospheric pressure plasma discharge.

SUMMARY OF THE INVENTION

The invention is related to a method as described in the appended claims. Said method comprises the steps of:
providing a substrate,
producing an atmospheric pressure plasma discharge in the presence of a gas,
at least partially exposing the substrate to said atmospheric pressure plasma discharge,
introducing a liquid aerosol or a vapour of coating forming material into said atmospheric pressure plasma discharge, thereby forming a coating on the substrate,
wherein said coating forming material comprises a non-polymerizable acetate derivative, i.e. an acetate derivative which is not polymerizable by classical chain-growth polymerization, in other words a saturated acetate derivative, in other words an acetate derivative having no double or triple bonds between carbon atoms.

The coating forming material can comprise a mixture of several of such acetate derivatives. According to the preferred embodiment, the coating forming material comprises or consists of ethyl acetate.

The substrate may be pre-treated by said plasma discharge, prior to the introduction of the coating forming material. Said plasma discharge may be a dielectric barrier discharge (DBD). Preferably, said discharge takes place between two parallel electrodes, at least one of which is covered by a dielectric layer, and wherein the gap width between said dielectric layers or between one dielectric layer and an electrode is less than or equal to 5 mm.

Said gas forms the atmosphere in which the plasma discharge is taking place. The gas is preferably supplied in the form of a gas flow. Said gas may be chosen from the group consisting of He, Ar, $N_2$, $CO_2$, $O_2$, $N_2O$, $H_2$ or a mixture of
} two or more of these. According to a preferred embodiment, the gas is $N_2$. According to another preferred embodiment, the plasma power is between 0.4 W/cm² and 1 W/cm², preferably in combination with a frequency between 1 kHz and 40 kHz and a gas flow between 10 slm and 60 slm.

The invention is equally related to a substrate comprising a hydrophilic coating applied according to the method of the invention, wherein the contact angle for water on said coating is less than 30°, more preferably less than 10°, most preferably equal to 10°.

The use of saturated acetate derivatives such as ethyl acetate as precursor, offers the advantages above other precursors that they are non hazardous, low cost and commonly available organic compounds. In this way, the present invention provides a drastic and stable improvement of the hydrophilicity of e.g. polymeric substrates, with a very good ageing resistance of the coated substrate. This stable hydrophilicity improvement can be used to enhance the adhesion properties of the substrate for a given application. By the method of the invention, it is possible to permanently enhance the hydrophilicity of a given substrate.

BRIEF DESCRIPTION OF THE DRAWINGS

FIG. 1 represents a schematic view of the preferred set-up for performing the method of the invention.

DETAILED DESCRIPTION OF PREFERRED EMBODIMENTS OF THE INVENTION

Embodiments of the present invention will now be described in detail with reference to the attached figures, the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of preferred embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that embodiments of the invention described herein are capable of operation in other sequences than described or illustrated herein.

Moreover, the terms top, bottom, left, right, over, under and the like in the description and the claims are used for descriptive purposes and not necessarily for describing relative positions. The terms so used are interchangeable under appropriate circumstances and embodiments of the invention described herein can operate in other orientations than described or illustrated herein. For example, "left" and "right" of an element indicates being located at opposite sides of this element.

It is to be noticed that the term "comprising" should not be interpreted as being restricted to the means listed thereafter; it does not exclude other elements or steps. Thus, the scope of the expression "a device comprising means A and B" should not be limited to devices consisting only of components A and B. It means that with respect to the present invention, A and B are relevant components of the device.

Where numerical values are given with regard to limitations of a quantity, or the outcome of a measurement, for the assessment of those values, account shall be taken of variations due to impurities, methods used to determine measurements, human error, statistical variance, etc.

Where a range of numerical values is defined as extending between a lower limit and an upper limit, the range is to be construed as including said lower limit and said upper limit, unless otherwise noted.

FIG. 1 is a schematic representation of a possible set-up for performing the method of the invention. The substrate 1 is placed on the lower-grounded-electrode 2, of a DBD plasma installation, which further comprises an upper high voltage electrode 3. At least one of said electrodes is covered with a dielectric barrier 4. In the case of FIG. 1, both electrodes are covered by a dielectric and the substrate is placed on the dielectric covering the lower electrode. According to the preferred embodiment of the method, the gap width between the electrodes (i.e. between dielectric layers or between a dielectric layer and an electrode) is less than or equal to 5 mm, preferably equal to 2 mm. If needed, an activation pre-treatment step is carried out preferably under a nitrogen atmosphere, but other gasses such as helium, argon, carbon dioxide, oxygen, hydrogen, $N_2O$, or mixtures of aforementioned gasses can be used. During the pre-treatment step, the frequency is preferably comprised between 1 and 100 kHz, more preferably between 1 and 50 kHz, and most preferably lower than 40 kHz, and the gas flow is comprised between 5 and 100 slm (standard liter per minute), more preferably between 10 and 60 slm.

When no pre-treatment step is applied, the coating forming material is introduced essentially simultaneously with the step of at least partially exposing the substrate to said atmospheric pressure plasma discharge.

For the treating (i.e. coating) step, the frequency is preferably comprised between 1 and 100 kHz, more preferably between 1 and 50 kHz, and most preferably lower than 40 kHz. The gas flow (e.g. nitrogen) is comprised between 5 and 100 slm, more preferably between 10 and 60 slm. The power is preferably not higher than 10 W/cm², more preferably not higher than 2 W/cm² and most preferably between 0.4 and 1 W/cm². It has been found that within the latter power range of 0.4-1 W/cm², the hydrophilicity increases with increasing power. The coating forming material 5 is injected under the form of a liquid aerosol 6. Alternatively, the coating forming material may be introduced under the form of a vapour. The method of introducing the vapour may be according to any technique. The method of the invention can lead to a coated substrate having a contact angle for water of less than 30°, more preferably less than 10°. According to a particular embodiment, the contact angle is 10°. These results may be obtained by keeping the plasma power during the deposition step between 0.4 W/cm² and 1 W/cm².

The coating forming material comprises or consists of a non-polymerizable acetate derivative, most preferentially ethyl acetate, or a mixture of said non-polymerizable acetate derivatives. A 'non-polymerizable' precursor is a precursor which cannot polymerize by chain-growth. Chain-growth (also referred to as step-growth), is the classic way to form polymers unsaturated monomers, i.e. monomers having double or triple bonds between C-atoms, are linked up with other monomers to form a repeating chain. This mechanism is made possible by the presence of the double or triple bonds. For this reason, the 'non-polymerizable' acetate derivatives of the invention can also be referred to as 'saturated acetate derivatives' or 'acetate derivatives having no double or triple bonds between C-atoms'. Besides ethyl acetate, other examples of saturated acetate derivatives are: bornyl acetate, 2-Ethoxyethyl acetate, 2-Ethylhexyl acetate, 2-Methoxyethyl acetate, 2-Pentyl acetate, 3-Octyl acetate, 4-Bromobutyl acetate, but this is not an exhaustive list.

The method can be performed in various types of installations. According to one embodiment, the plasma treatment and coating steps are performed in a suitable plasma installation, for example an installation as described in WO2005/095007 (included by reference).

Examples of substrates which can be submitted to the surface treatment described in the invention may be plastics, such as polyethylene, polypropylene, or polyolefin copolymers, or cyclic olefin copolymers, polystyrene and polystyrene derivatives, polycarbonate, polyethylene terephtalate, polybutylene terephtalate, acrylic resins, polyvinyl chloride, polyamide, polysulfone, poly(vinylidene fluorine) or its copolymers, poly(tetrafluoroethylene) and its copolymers, poly(vinylidene chloride) and its copolymers, cellulose, polylactic acid, polycaprolactone, polycaprolactam, polyethylene glycol, metals, glass, ceramics, paper, composite materials, textiles, wood, but are not limited to these examples.

According to a preferred embodiment, the method of the invention is applied in the presence of nitrogen gas. It has been found that ethyl acetate, deposited in a nitrogen gas flow, leads to the creation of amide functions on the coating surface. This amount of amide functions further increases with the plasma reaction time.

EXAMPLES

Example 1

The plasma treatment is carried out in a specially designed parallel plates DBD plasma installation at atmospheric pressure using a discharge frequency of 1.5 kHz. A sheet of poly(ethylene terephtalate) of 20×30 cm$^2$ is placed on the lower electrode of the installation. The activation step is carried out under nitrogen at a flow of 40 slm, for 13 seconds at a power of 0.8 W/cm$^2$. Ethyl acetate is then injected under the form of an aerosol in the plasma zone under a nitrogen flow of 20 slm. The coating deposition is carried out during 30 seconds.

The contact angle with water of the untreated substrate is 67°. After treatment with ethyl acetate in an atmospheric plasma discharge, the contact angle with water is 10° and remains at this level for several months.

Example 2

The plasma treatment is carried out in a specially designed parallel plates DBD plasma installation at atmospheric pressure using a discharge frequency of 40 kHz. A sheet of poly(propylene) of 20×30 cm$^2$ is placed on the lower electrode of the installation. The treatment is carried out under nitrogen at a flow of 20 slm, where ethyl acetate is injected under the form of an aerosol in the plasma zone. The plasma treatment is carried out during 13 seconds at a power of 0.8 W/cm$^2$.

The contact angle with water of the untreated substrate is 98°. After treatment with ethyl acetate in an atmospheric plasma discharge, the contact angle with water is 10° and remains stable for several months.

The invention claimed is:

1. A method for applying a hydrophilic coating on a substrate, said method comprising the steps of:
   providing a substrate,
   producing an atmospheric pressure plasma discharge in N$_2$ between electrodes of a plasma installation,
   at least partially interposing the substrate between the electrodes such that the substrate is exposed to said atmospheric pressure plasma discharge,
   introducing a liquid aerosol or a vapour of coating forming material into said atmospheric pressure plasma discharge, forming a coating on the substrate,
   wherein said coating forming material comprises a non-polymerizable acetate derivative, wherein a coating deposition time is 30 seconds or less and wherein a contact angle for water on said coating is less than 30°.

2. The method according to claim 1, wherein said coating forming material comprises a mixture of several non-polymerizable acetate derivatives.

3. The method according to claim 1, wherein said coating forming material comprises ethyl acetate.

4. The method according to claim 1, wherein said coating forming material is ethyl acetate.

5. The method according to claim 1, wherein said substrate is pre-treated by said plasma discharge, prior to the introduction of the coating forming material.

6. The method according to claims 1, wherein said plasma discharge is a dielectric barrier discharge.

7. The method according to claim 6, said discharge taking place between two parallel electrodes, at least one of which is covered by a dielectric layer, and wherein the gap width between said dielectric layers or between one dielectric layer and an electrode is less than or equal to 5 mm.

8. The method according to claim 1, wherein said plasma discharge takes place at a power between 0.4 W/cm$^2$ and 1 W/cm$^2$ of the electrode.

9. The method according to claim 8, wherein said plasma discharge takes place under the conditions of:
   frequency is between 1 kHz and 40 kHz, and
   flow of said N$_2$ is between 10 slm and 60 slm.

10. The method according to claim 1, wherein the contact angle for water on said coating is less than or equal to 10°.

11. The method according to claim 1, wherein the non-polymerizable acetate derivative is one or a combination of ethyl acetate, bornyl acetate, 2-ethoxyethyl acetate, 2-ethylhexyl acetate, 2-methoxyethyl acetate, 2-pentyl acetate, 3-octyl acetate, and 4-bromobutyl acetate.

12. A method for enhancing hydrophilicity of a substrate, comprising:
   producing an atmospheric pressure plasma discharge between electrodes of a dielectric barrier discharge apparatus, wherein the plasma discharge takes place in a nitrogen atmosphere,
   at least partially interposing the substrate between the electrodes such that the substrate is exposed to said atmospheric pressure plasma discharge,
   introducing a liquid aerosol or a vapor of a non-polymerizable acetate derivative into said atmospheric pressure plasma discharge to treat the substrate,
   wherein a treatment time is 30 seconds or less and wherein a contact angle for water on the treated substrate is less than 30°.

13. The method according to claim 12, wherein the non-polymerizable acetate derivative is one or a combination of ethyl acetate, bornyl acetate, 2-ethoxyethyl acetate, 2-ethylhexyl acetate, 2-methoxyethyl acetate, 2-pentyl acetate, 3-octyl acetate, and 4-bromobutyl acetate.

14. The method according to claim 12, wherein the contact angle for water on the treated substrate is less than or equal to 10°.

15. The method according to claim 12, wherein the dielectric barrier discharge apparatus is operated at a frequency between 1 kHz and 100 kHz.

\* \* \* \* \*